United States Patent [19]

Suzuki et al.

[11] Patent Number: 4,887,758
[45] Date of Patent: Dec. 19, 1989

[54] APPARATUS FOR CONNECTING EXTERNAL LEADS

[75] Inventors: Yasunobu Suzuki; Motohiko Kato; Akio Bando, all of Tokyo; Hisao Ishida, Saitama; Akihiro Nishimura, Tokyo, all of Japan

[73] Assignee: Kabushiki Kaisha Shinkawa, Tokyo, Japan

[21] Appl. No.: 302,473

[22] Filed: Jan. 26, 1989

[51] Int. Cl.$^4$ ............... B23K 20/26; H01L 21/603
[52] U.S. Cl. ..................... 228/5.1; 228/6.2; 228/13
[58] Field of Search ............ 228/5.1, 6.2, 13, 180.2

[56] References Cited

U.S. PATENT DOCUMENTS

| 3,791,018 | 2/1974 | Johnston et al. | 228/6.2 X |
| 4,404,741 | 9/1983 | Lebet et al. | 228/6.2 X |
| 4,411,149 | 10/1983 | Delorme | 228/6.2 X |

Primary Examiner—Kenneth J. Ramsey
Attorney, Agent, or Firm—Koda & Androlia

[57] ABSTRACT

An apparatus for connecting or bonding leads of solid-state devices to lead frames, etc. in which a solid-state device punched out of a film carrier by a punch is first picked up and held by a suction-adhesion head. A raising and lowering arm is then driven longitudinally and laterally so that the suction-adhesion head with the solid-state device thereon is moved to a position over a first bonding station. Then, the raising and lowering arm is lowered via a vertical driving mechanism, and the solid-state device held by the suction-adhesion head is pressed against a specified lead frame. A first bonding tool is lowered and simultaneously bonds the leads on two opposite sides of the solid-state device to the lead frame. Then, the first bonding tool is raised, and the suction-adhesion head is raised and moves back to a position over the punch. The lead frame to which two sides of the solid-state device have been thus bonded is fed, and at a second bonding position, the leads on the other two opposite sides of the solid-state device are bonded to the lead frame by a second bonding tool.

3 Claims, 10 Drawing Sheets

APPARATUS FOR CONNECTING EXTERNAL LEADS

BACKGROUND OF THE INVENTION

1. Field of the Invention

The present invention relates to an apparatus for connecting leads to lead frames, etc. and more particularly to an apparatus for bonding external leads of solid-state devices punched out from a film carrier to lead frames, substrates, etc.

2. Prior Art

Figure 11:
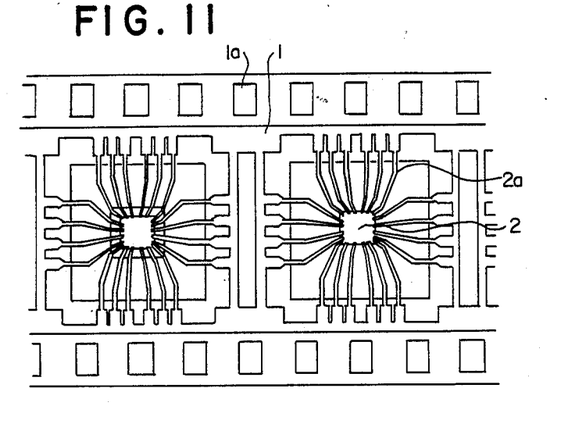
FIG. 11 is a plan view of a film carrier.
Figure 12:
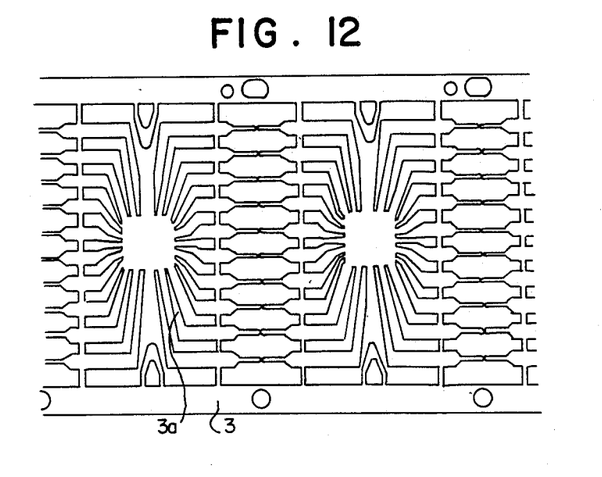
FIG. 12 is a plan view of lead frames.
Figure 13:
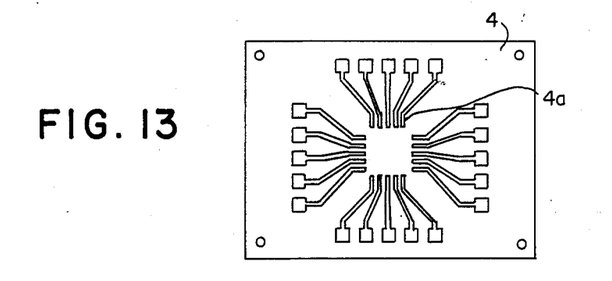
FIG. 13 is a plan view of a substrate.
Figure 14:
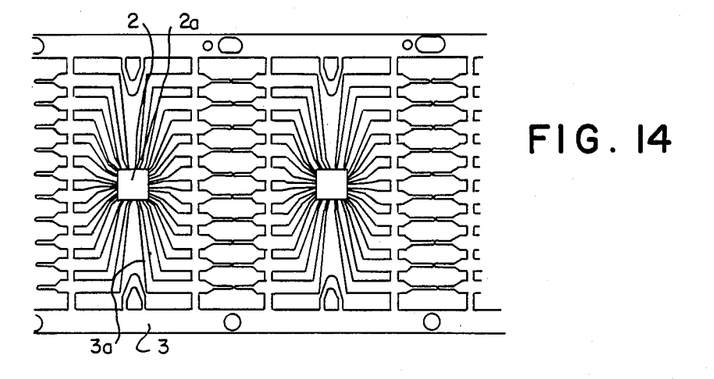
FIG. 14 is a plan view of a solid state device bonded to a lead frame.
Figure 15A:
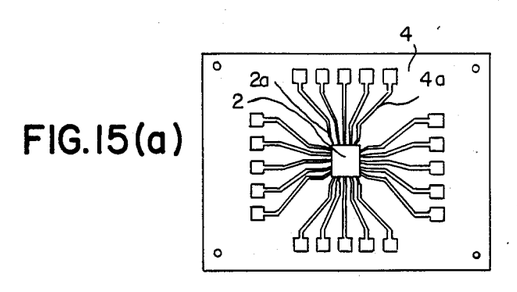
FIGS. 15(a) and 15(b) show a plan view and a side view of a solid state device bonded to a substrate, respectively.
Figure 15B:
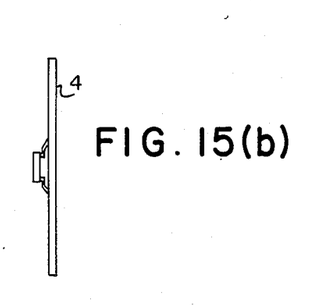

An apparatus which connects external leads to lead frames, substrates, etc. works basically as follows: First, a solid-state device 2 (shown in FIG. 11) supported by external leads 2a on a film carrier 1 having sprocket holes 1a on both sides thereof is first punched out. The thus punched-out solid-state device 2 is positioned so that the leads 2a are aligned with lead connecting parts 3a or 4a of a lead frame 3 (shown in FIG. 12) or substrates 4 (shown in FIG. 13), respectively. The leads 2a are then bonded to the lead connecting parts 3a or 4a (as shown in FIGS. 14 and 15) to complete the entire connecting process.

Throughout the specification, the term "lead frames" refers not only to lead frames 3 but also to substrates 4.

Conventional apparatuses for connecting external leads can generally be divided into two types.

In the first type, a film carrier and lead frames are positioned so that the lead frames are laid over the film carrier. The solid-state devices on the film carrier are punched out, and at the same time, the thus punched-out solid-devices are bonded by heat and pressure to lead frames located overhead.

In the second type of apparatus, the film carrier and lead frames are positioned side by side. The solid-state devices on the film carrier are punched out, picked up by vacuum suction adhesion and then transferred to the lead frames. In this apparatus, bonding is accomplished by a separate bonding apparatus.

The above-described apparatus (the first type) is mainly for handling solid-state devices which have a small number of leads. If the solid-device device has a great number of leads, a higher degree of precision is required to position the leads exactly on the solid-state device and the lead frame. Accordingly, the positioning of this apparatus in which the lead frames are merely superimposed on the film carrier causes frequent positioning errors and the yield drops conspicuously. Furthermore, it is difficult to monitor the lead frames and film carrier separately. Thus, the precision of positioning tends to be poor.

On the other hand, in the second type of apparatus, a difficult question rises as to how the solid-state devices (which are punched out of the film carrier) are to be fixed in place on the lead frames. To solve this problem, several different methods are employed. For example, in one method, the solid-state device is temporarily held and set in the proper position on the corresponding lead frame. Then, the leads on each side of the solid-state device are bonded in separate steps via a bonding tool that is arranged so as not to interfere the temporary positioning of the solid-state device.

In another method, each punched-out solid-state device is placed on the lead frame without it being temporarily held, and the leads on the respective sides of the solid-state device are all bonded at the same time.

However, these methods have their drawbacks in that if the bonding process is divided into several steps, working efficiency becomes poor. On the other hand, the precision of the position doing the bonding tends to decrease if the bonding is performed without the solid-state devices being held temporarily.

SUMMARY OF THE INVENTION

Accordingly, a primary object of the present invention is to provide an apparatus for connecting external leads which eliminates the drawbacks found in conventional devices. The apparatus of the present invention has high working efficiency and is usable for solid-state devices which have many external leads.

The abovementioned and other objects of the present invention are accomplished by the unique structure thereof which includes: a punch-out means which removes solid-state devices from a film carrier by punching them out; a raising and lowering arm which is raised and lowered and has a suction-adhesion head which holds the punched-out devices by suction-adhesion; a lead frame feeding means which feeds out lead frames, to which the punched-out devices are to be mounted, along a prescribed conveyance path; an X-Y table which carries the raising and lowering arm and moves longitudinally and laterally so that it conveys the raising and lowering arm to a point above a first bonding station on the lead frame path; a vertical driving mechanism provided on the X-Y table which drives the raising and lowering arm up and down; and a first bonding means which is provided above the first bonding station and equipped with a bonding tool.

The first bonding means has an escape part formed therein so that the bonding means does not interfere with the suction-adhesion head of the raising and lowering arm. The first bonding means simultaneously bonds the leads of two opposite sides of each solid-state device to one of the lead frames while the solid-state device is pressed against the lead frame by the suction-adhesion head.

The connecting apparatus of the present invention further includes a second bonding means which is provided above a second bonding station on the lead frame path. The second bonding means is equipped with a bonding tool which simultaneously bonds leads provided on the other two opposite sides of each solid-state device to the lead frame.

With the above-described structure, each solid-state device punched out of the film carrier by the punching action of the punch-out means is first picked up and held by the suction-adhesion head. The raising and lowering arm is then driven longitudinally and laterally by the X-Y table so that the suction-adhesion head with the solid-state device thereon is moved to a position over the first bonding station on the lead frame path. Then, the raising and lowering arm is lowered via the vertical driving mechanism, and the solid-state device held by the suction-adhesion head is pressed against a specified lead frame. The first bonding tool of the first bonding means is lowered, and the bonding tool simultaneously bonds the leads on two opposite sides of the solid-state device to the lead frame. Then, the first bonding tool is raised, and the suction-adhesion head is raised and caused to move back to the position over the punch-out means. The lead frame to which two sides of the solid-state device have been thus bonded is intermittently fed, and at the second bonding position, the leads on the other two opposite sides of the solid-state device are bonded to the lead frame by the second bonding tool of the second bonding means. The bonding action of the second bonding means is performed at the same time as the bonding action of the first bonding means.

DETAILED DESCRIPTION OF THE INVENTION

An embodiment of the present invention will be described in detail with reference to the accompanying drawings.

Figure 1:
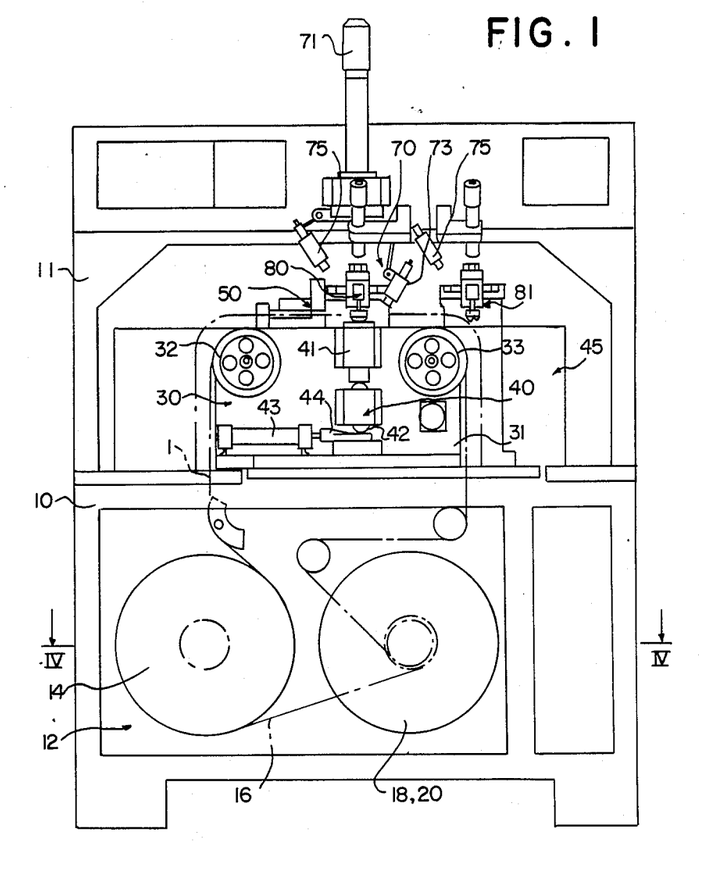
FIG. 1 is a front view of the apparatus for connecting external leads provided by the present invention.
Figure 2:
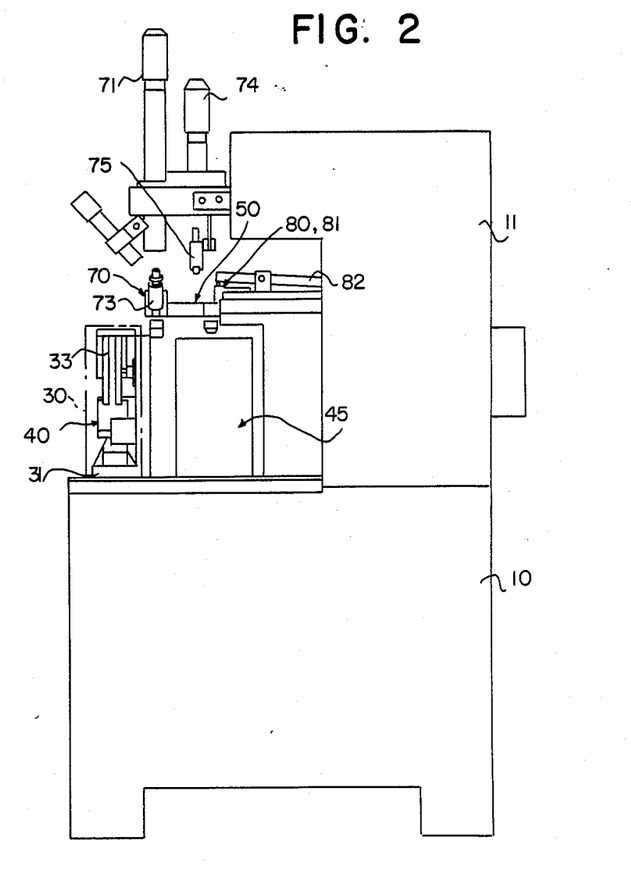
FIG. 2 is a right side view thereof.
Figure 3:
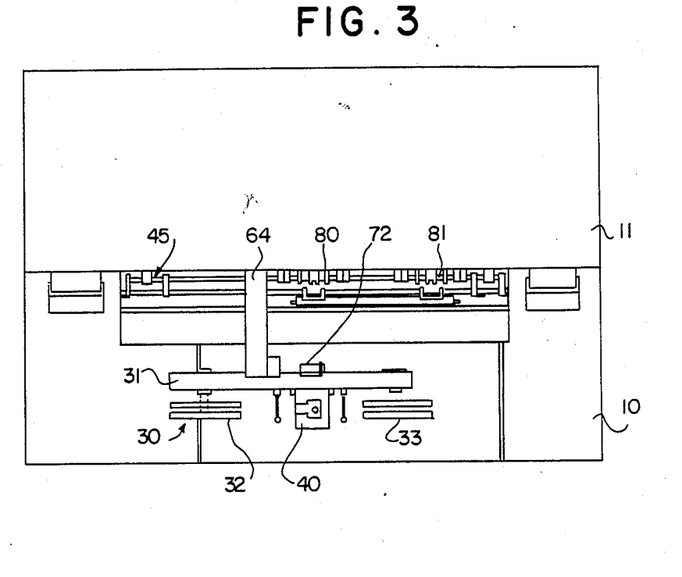
FIG. 3 is a plan view thereof.

As shown in FIGS. 1 through 3, the overall frame of the apparatus of the present invention includes a main body 10 and a control box 11 which is provided on top of the main body 10.

A supply/storage section 12 for a film carrier 1 is provided in the main body 10. A fixed-rate feeding means 30 for the film carrier 1 which is fed out of the supply/storage means 12, and a punching unit 40 which punches solid-state devices 2 out of the film carrier 1, are provided on the main body 10.

Also provided on the main body 10 are a feeding means 45 for feeding lead frames 3, which is a conventional claw-type or belt-type conveying means, a transfer arm means 50 which transfers solid-state devices 2 which are punched out of the film carrier 1 to specified positions on the lead frames 3, and an optical means 70 which confirms the position of each solid-state device 2 during the transfer of the device 2. In addition, two bonding means, i.e., first and second bonding means 80 and 81 are provided on the main body 10. These bonding means 80 and 81 bond the transferred solid-state devices 2 to lead frames 3 at bonding stations located along the path of the feeding means 45 for lead frames 3.

Figure 4:
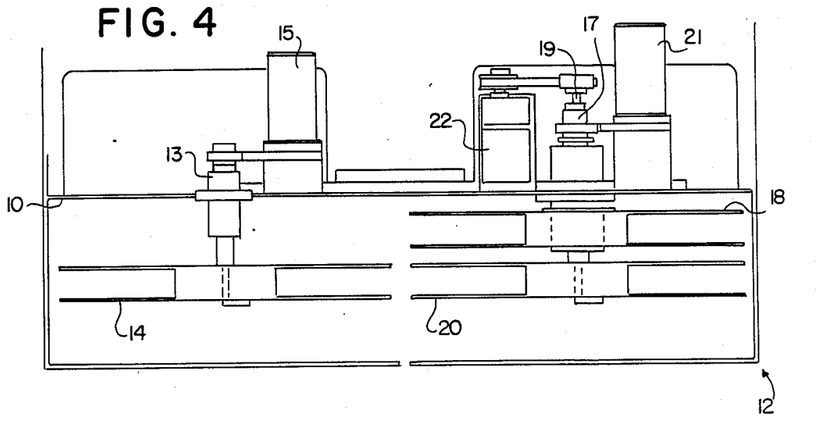
FIG. 4 is a partial cross-sectional view taken along line IV—IV of FIG. 1, illustrating the film carrier supply and take-up reels of the present invention.

As seen in FIGS. 1 and 4, in the supply/storage section 12, a supply reel 14 is rotatably mounted on a rotary shaft 13 which is provided on the main body 10. The rotary shaft 13 is caused to rotate by a synchronous motor 15. A film carrier 1 and a spacer tape 16, which prevents damage to the solid-state devices 2 due to overlapping of the solid-state devices 2 during winding, are wound together on the supply reel 14. These elements comprise the supply-side of the supply/storage means 12.

The storage-side of the supply/storage means 12 includes a hollow rotary shaft 17 which is provided on the main body 10. A film carrier take-up reel 18 is mounted on the shaft 17 so as to be parallel to, but offset from, the supply reel 14. Also, a spacer tape reel 20 is mounted on a rotatable axle 19 which is coaxially provided in the hollow rotary shaft 17. The spacer tape reel 20 is arranged so as to be flush with the supply reel 14. The rotary shafts 17 and 19 are caused to rotate by synchronous motors 21 and 22, respectively.

As seen from FIGS. 1 through FIG. 3 and 5, the fixed-rate feeding means 30 for the film carrier 1 is provided on the traveling path of the film carrier 1 which is fed out from the supply reel 14. The feeding means 30 includes two sprocket wheels 32 and 33. These wheels 32 and 33 are provided on the supporting base 31 of on the main body 10 and rotated via a sprocket-rotating synchronous motor (not shown) through a belt transmission device (not shown). Teeth provided on the circumferences of the sprocket wheels 32 and 33 engage with the sprocket holes 1a of the film carrier 1 so that the film carrier 1 is fed forward a fixed distance in accordance with the fixed-angle and intermittent rotation of the sprocket-rotating synchronous motor.

Figure 5:
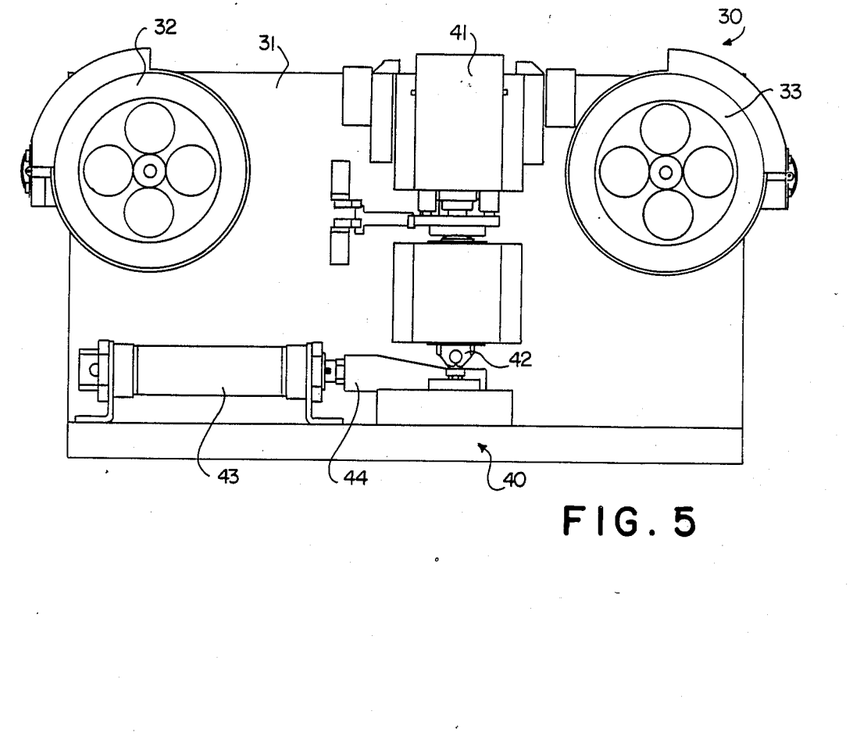
FIG. 5 is a detailed illustration of the film carrier feeding section and the punching unit of the apparatus of this invention.

The punching unit 40, which punches the solid-state devices 2 out of the film carrier 1, is provided along the fixed-rate feed path of the film carrier 1 running between the sprocket wheels 32 and 33. The punching unit 40 includes a punching actuator 41, which clamps the film carrier 1 and punches out the solid-state devices 2 via a punching tool, and a direct-acting cam follower 42, which is installed underneath the punching actuator 41 for raising and lowering the punching actuator 41. A reciprocating linear cam 44 of the punching unit 40 is driven by an air cylinder 43. The liner cam 44 contacts and raises and lowers the cam follower 42.

As described above, the lead frame feeding means 45 is a prior art claw-type or belt-type conveying means and feeds the lead frames 3 via an intermittent fixed-rate feeding action. Furthermore, separate conveying means (not shown) are respectively installed on the supply-side and discharge side of the feeding means 45, so that a large number of lead frames 3 can be automatically fed forward.

The transfer arm means 50 transfers the solid-state devices 2. As seen from FIGS. 1, 2, 6 and 7, the transfer arm means 50 includes an X-direction guide rail 51 and an X-direction moving table 53. The X-direction guide rail 51 extends in the direction (X direction) parallel to the path of the film carrier 1 which is provided on the main body 10. The X-direction moving table 53 is moved along the rail 51 via a feed motor 52 using a conventional feed-screw mechanism.

Figure 6:
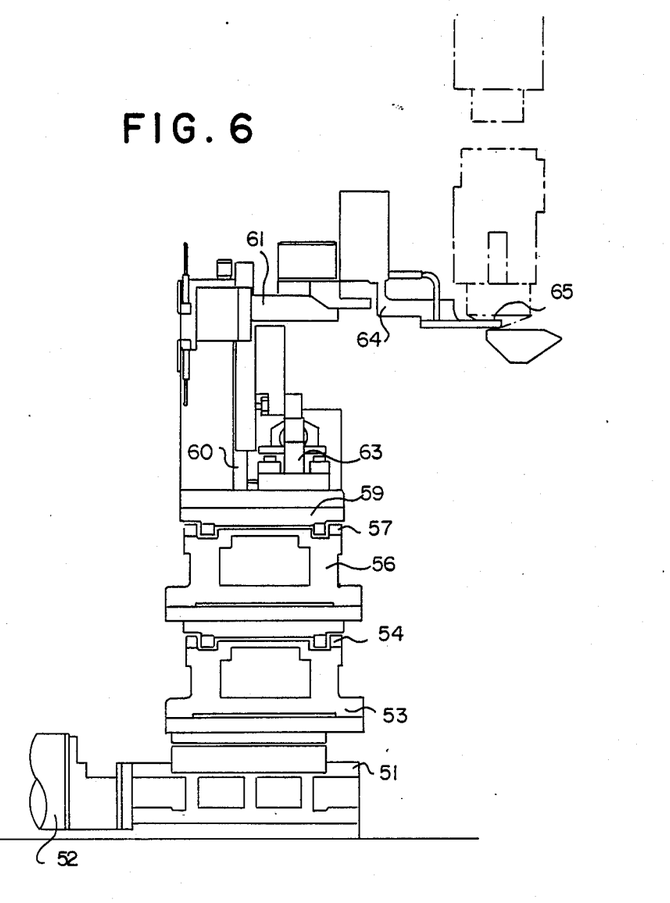
FIG. 6 is a detailed illustration of the solid-state device transfer section.
Figure 7:
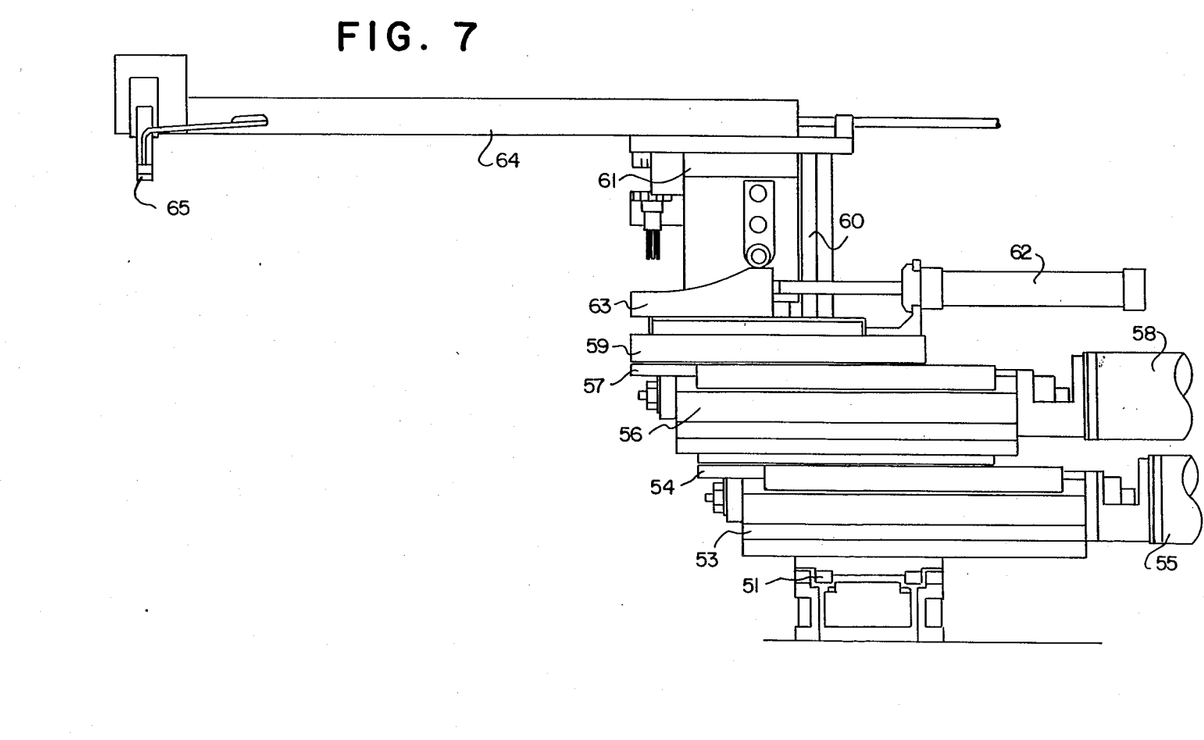
FIG. 7 is a detailed illustration showing the right side of the transfer section of FIG. 6.

The transfer arm means 50 further includes a first Y-direction guide rail 54 and a first Y-direction moving table 56. The first Y-direction guide rail 54 is provided on the X-direction moving table 53 and extends in the direction perpendicular to the X-direction, i.e., in the Y direction. The first Y-direction moving table 56 is moved along the rail 54 via a feed motor 55 using a conventional feed-screw mechanism.

The transfer arm means 50 further includes a second Y-direction guide rail 57 and a second Y-direction moving table 59. The second Y-direction guide rail 57 is provided on the first Y-direction moving table 56 and extends in the Y direction. The second Y-direction moving table 59 is moved along this second Y-direction guide rail 57 via a feed motor 58 using a feed-screw mechanism.

Furthermore, a raising and lowering rail 60 is provided on the second Y-direction moving table 59, and a raising and lowering table 61 is raised and lowered along the rail 60. A reciprocating linear cam 63 is driven by an air cylinder 62 and raises and lowers the raising and lowering table 61. A raising and lowering arm 64 is fixed on the raising and lowering table 61 and extends in the Y direction. Furthermore, a vacuum suction-adhesion head 65 of the arm means 50 is provided on the tip of the raising and lowering arm 64.

The vacuum suction-adhesion head 65 can be moved to a point directly above the punching unit 40 by the movements of the X- and Y-direction moving tables 53, 56 and 59, so that the solid-state devices 2 punched out by the punching tool can be picked up "as is" by the vacuum suction-adhesion head 65.

Figure 8:
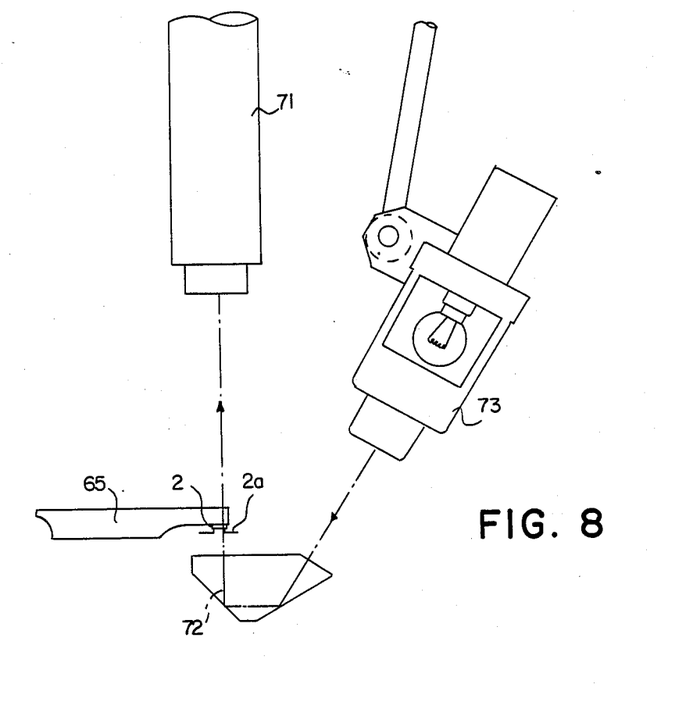
FIG. 8 is an explanatory diagram illustrating the operation of the optical position detecting means installed in the solid-state device transfer section.

The optical means 70 confirms the position of each solid-state device 2 picked up by the vacuum suction-adhesion head 65. The optical means 70 includes two different confirming means: one (first confirming means) which checks for any positional discrepancies in the solid-state device 2 itself adhered to the vacuum suction-adhesion head 65 through vacuum suction, and another (second confirming means) which checks for any discrepancies in the position of the lead frame 3 fed out by the feeding means 45 for lead frames 3 relative to a standard position.

The first confirming means includes a camera 71 which is provided directly above the transfer path of the solid-state device 2, a prism 72 which is directly underneath the camera 71, and a projector 73 which projects light so that the light is refracted by the prism 72 and enters into the camera 71. The second confirming means includes a camera 74 which is provided directly above a prescribed first bonding station on the path of the lead frames 3, and a projector 75 which projects light so that the light is reflected by the lead frame 3 and enters the camera 74.

Figure 9A:
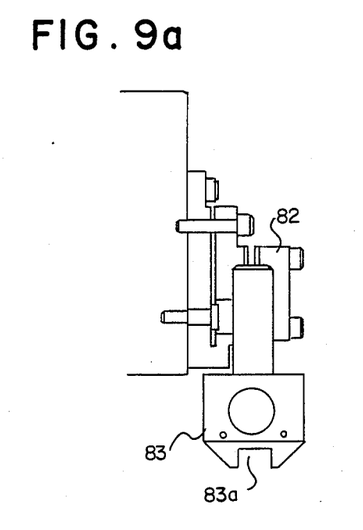
FIG. 9(a) illustrates a front view of a bonding tool used in a bonding means of this invention.
Figure 9B:
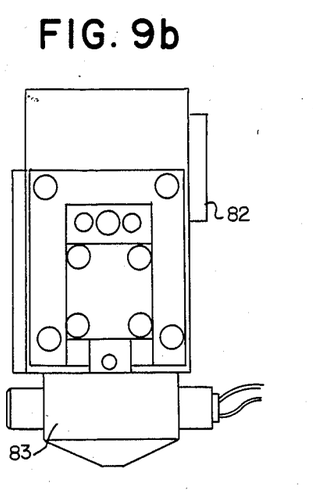
FIG. 9(b) is a right side view thereof.

The bonding means 80 and 81 are respectively provided above the first bonding station and above the second bonding station which is provided on the conveyance path of the lead frames 3 and adjacent to the first bonding station. In these bonding means 80 and 81, a bonding tool 83 which is equipped with a central escape part 83a as shown in FIG. 9 is mounted to the tip of a bonding arm 82 which extends from a bonding head of prior art so that it can be raised and lowered.

Figure 10:
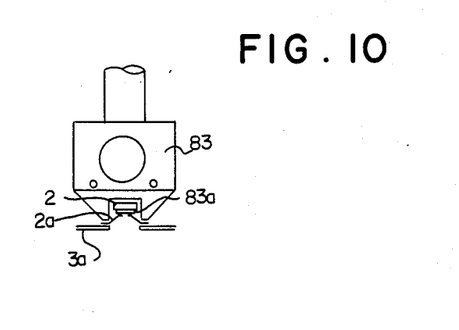
FIG. 10 illustrates the operating state of the bonding tool during the bonding process.

As shown in FIG. 10, the bonding tool 83 is designed so that it straddles the main body of the solid-state device 2 and is thus able to bond the external leads 2a of two opposite sides of the solid-state device 2 while avoiding any interference with other objects. In the first bonding means 80 installed above the first bonding station, the escape part 83a of the bonding tool 83 is formed so that the vacuum suction-adhesion head 65 can be avoided by the bonding tool 83. In the second bonding means 81 installed above the second bonding position, the escape part 83a of the bonding tool 83 is formed so that it is perpendicular to the escape part 83a of the bonding tool 83 of the first bonding means 80.

The operation of the above-described apparatus of this invention will be described below.

The film carrier 1 is released from the supply reel 14 and fed by the sprocket wheels 32 and 33 via a fixed-rate feeding action. In this case, the synchronous motor 15 rotates intermittently and synchronously with the sprocket-rotating synchronous motor 15 so that both excessive tension and slack in the film carrier 1 are prevented.

When the film carrier 1 is fed a fixed distance and the solid-state device 2 is positioned in a predetermined position above the punching actuator 41 of the punching unit 40, the air cylinder 43 is actuated, and the linear cam 44 moves to the right. As a result, the direct-acting cam follower 42 rises, pushing the punching tool (not shown) of the punching actuator 41 upward. After the film carrier 1 is clamped in place via a mechanism known in the prior art, the solid-state device 2 is punched out in an upward direction by the punching tool. At this time, the solid-state device 2 is separated from the film carrier 1 and rests on the surface of the punching tool.

As a result of the rotation of the feed motors 52, 55 and 58, the X-Y table is moved, and the vacuum suction-adhesion head 65 provided at the tip of the raising and lowering arm 64 is positioned directly above the solid-state device 2. When the air cylinder 62 is actuated, and the linear cam 63 is retracted, the raising and lowering table 61 is lowered. As a result, the raising and lowering arm 64 is lowered, and the vacuum suction-adhesion head 65 picks up and holds the solid-state device 2 by suction-adhesion. Afterward, the air cylinder 62 is actuated reversely, and the linear cam 63 advances. As a result, the raising and lowering table 61 is raised, and the raising and lowering arm 64 holding the solid-state device 2 rises.

Next, the X-Y table is again actuated so that the raising and lowering arm 64 is shifted, and the solid-state device 2 is positioned beneath the optical mean 70 which confirms the position of the solid-state device 2. The light emitted from the projector 73 is refracted by the prism 72, passes through the solid-state device 2 from below and enters the camera 71.

The external leads 2a of the solid-state device 2 are unstable and may easily shift due to the cutting executed by the punching action. Accordingly, if the image of the solid-state device 2 should be obtained by a camera via the light which is reflected by the surfaces of solid-state devices, the brightness of the light tends to be uneven, and the image tends to be unclear. If an attempt is made to detect the position of the solid-state device 2 by means of such a system as described above, detection errors would occur very frequently.

However, in the present invention, images of the solid-state devices 2 are obtained via the light transmitted through the solid-state device 2 and external leads 2a, the external leads 2a and solid-state device 2 are projected as shadows. Thus, contrast is enhanced, and it is extremely unlikely that any detection errors would occur through the automatic detection which is done by the camera 71.

The image obtained by the camera 71 is processed by a recognition unit (not shown). At the same time, light emitted from the projector 75 is reflected by the surface of the lead frame 3 and enters the camera 74. Thus, the image of the lead frame 3 obtained by such reflected light is also processed by the same recognition unit.

Any discrepancies detected in these two positions are fed back to the feed motors 52, 55 and 58, and these motors are rotated so that the discrepancies are corrected. As a result, the raising and lowering arm 64 is further moved so that the solid-state device 2 is correctly positioned directly above the predetermined position on the lead frame 3.

Furthermore, in this series of actions, the raising and lowering arm 64 has two tables, i.e., the first and second Y-direction moving tables 56 and 59, which move in the Y-direction, as well as feed motors 55 and 58 which drive these tables. If it is desired, these motors can be operated simultaneously. Accordingly, the time required for the overall stroke in the Y-direction can be cut in half, so that the working efficiency is improved. In this case, one or both of the feed motors 55 and 58 might be replaced by a simple linear actuator for obtaining a motive force such as an air cylinder, etc. However, from the standpoint of free positioning within the overall stroke and fine corrections, etc., it is desirable that both of the driving devices used in this case be feed motors.

When positioning is completed, the air cylinder 62 is again actuated so that the linear cam 63 is retracted. As a result, the raising and lowering arm 64 is lowered, and the vacuum suction-adhesion head 65 correctly positions the solid-state device 2 in a prescribed position on the lead frame 3. Thus, the vacuum suction-adhesion head 65 holds the solid-state device 2 in place while pressing the solid-state device 2 lightly downward. In this state, the bonding arm 82 of the first bonding apparatus 80 is lowered by a means known in the prior art, and the bonding tool 83 of the bonding arm 82 simultaneously bonds the external leads 2a provided on two opposite sides of the solid-state device 2 to the lead frame 3 while avoiding interference with both the solid-state device 2 and the vacuum suction-adhesion head 65 via the escape part 83a of the bonding tool 83.

Afterward, when the bonding arm 82 is raised, the vacuum suction-adhesion head 65 stops the suction-adhesion action on the solid-state device 2 and rises. The vacuum suction-adhesion head 65 is then returned to a position above the punching unit 40 in order to repeat the above-described series of actions.

The solid-state device 2 with half of its external leads 2a bonded to the lead frame 3 is intermittently fed for a fixed distance by the feeding means 45 so that it reaches the second bonding position. Here, the external leads 2a on the other two opposite sides of the solid-state device 2 are simultaneously bonded to the lead frame 3 by a second bonding means 81 in the same manner as in the case of the first bonding means 80. Thus, the bonding or connection of the external leads 2a is completed.

The film carrier 1 passes through the punching unit 40 and is taken up on the film carrier take-up reel 18 via the sprocket wheel 33. In this case, the synchronous motor 21 is intermittently rotated in accordance with the intermittent rotation of the sprocket wheel 33, so that the film carrier 1 is smoothly taken up by the reel 18. The spacer tape 16 is separately taken up on the reel 20 provided next to the supply reel 14, since the spacer tape 16 can be reused, unlike the film carrier 1 which is discarded after the solid-state devices 2 have been punched out. The spacer tape take-up reel 20 is coaxial with the film carrier take-up reel 18; therefore, the space efficiency of the apparatus is extremely good.

In the lead connecting apparatus of this invention, as is clear from the above description, an escape part is formed in each of the bonding tools. Accordingly, solid-state devices can be connected or bonded to lead frames with high precision while being held against the lead frames by the vacuum suction-adhesion head. Furthermore, the external leads on two opposite sides of each solid-state device are bonded simultaneously, and two bonding means are arranged so that two pairs of external leads which are in perpendicular to each other can be separately and successively bonded. Accordingly, the same working efficiency can be obtained as when simultaneously bonding the external leads of all four sides of each solid-state device.

We claim:

1. An apparatus for connecting external leads comprising:
   a punch-out means which removes solid-state devices from a film carrier by punching them out;
   a raising and lowering arm provided with a suction-adhesion head which holds said punched-out devices by suction adhesion;
   a lead frame feeding means which feeds lead frames, on which said solid-state devices are to be mounted, along a predetermined path;
   an X-Y table which carries said raising and lowering arm and moves longitudinally and laterally so that it conveys said raising and lowering arm to a point above a first bonding station on said lead frame conveyance path;
   a vertical driving mechanism provided on said X-Y table, said vertical driving mechanism driving said raising and lowering arm up and down;
   a first bonding means provided on said first bonding station and equipped with a bonding tool which has an escape part formed therein so that it does not interfere with the suction-adhesion head part of said raising and lowering arm, said first bonding tool simultaneously bonding the leads provided along two opposite sides of each of said solid-state device to one of said lead frames while said solid-state device is pressed against said lead frame by said suction-adhesion head; and
   a second bonding means provided on a second bonding station on said lead frame conveyance path, said second bonding means being provided with a bonding tool which simultaneously bonds leads provided on the other two opposite sides of each solid-state device to the said lead frame.

2. An apparatus for connecting external leads comprising:
   a punch-out means which removes solid-state devices from a film carrier by punching them out;
   a raising and lowering arm provided with a suction-adhesion head which holds said punched-out devices by suction adhesion;
   a lead frame feeding means which conveys lead frames, to which said devices are to be mounted, along a predetermined path;
   an X-Y table which carries said raising and lowering arm and moves longitudinally and laterally so that it conveys said raising and lowering arm to a point above a first bonding station on said lead frame conveyance path;
   a vertical driving mechanism provided on said X-Y table, said vertical driving mechanism driving said raising and lowering arm up and down;

a first bonding means provided on said first bonding station and equipped with a bonding tool which has an escape part formed thereon so that it does not interfere with the suction-adhesion head part of said raising and lowering arm, said bonding tool simultaneously bonding the leads provided along two opposite sides of each of said solid-state devices to one of said lead frames while said solid-state device is pressed against said lead frame by said suction-adhesion head;

a second bonding means provided on a second bonding station on said lead frame conveyance path, said second bonding means being provided with a bonding tool which simultaneously bonds leads provided on the other two opposite sides of said solid-state device to said lead frame;

a first camera installed above a transfer path of each of said solid-state device held by said suction-adhesion head, said first camera detecting any discrepancy in the position of said solid-state device; and a second camera installed directly above said first bonding position, said second camera detecting any discrepancy in the position of said lead frame.

3. An apparatus for connecting external leads according to claim 2 wherein said first camera picks up an image of shadows of said external leads via light applied from underneath.

* * * * *